United States Patent
Kishimura et al.

(10) Patent No.: US 6,753,132 B2
(45) Date of Patent: Jun. 22, 2004

(54) PATTERN FORMATION MATERIAL AND PATTERN FORMATION METHOD

(75) Inventors: Shinji Kishimura, Itami (JP); Masayuki Endo, Izumi (JP); Masaru Sasago, Hirakata (JP); Masamitsu Shirai, Ibaraki (JP); Masahiro Tsunooka, Sennan (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 151 days.

(21) Appl. No.: 10/034,366

(22) Filed: Jan. 3, 2002

(65) Prior Publication Data

US 2003/0113670 A1 Jun. 19, 2003

(30) Foreign Application Priority Data

Apr. 11, 2001 (JP) .................................. 2001-112174

(51) Int. Cl.$^7$ .................................. G03F 7/00
(52) U.S. Cl. .................. 430/322; 430/313; 430/311; 430/270.1; 430/907; 430/967
(58) Field of Search ................. 430/322, 313, 430/311, 270.1, 907, 967

(56) References Cited

U.S. PATENT DOCUMENTS 6,610,456 B2 * 8/2003 Allen et al. ............ 430/270.1

* cited by examiner

*Primary Examiner*—Mark F. Huff
*Assistant Examiner*—Daborah Chacko-Davis

(57) ABSTRACT

A resist film is formed by applying, on a substrate, a pattern formation material containing a polymer including a first unit represented by Chemical Formula 1 and a second unit represented by Chemical Formula 2, and an acid generator:

Chemical Formula 1:

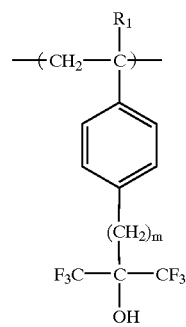

Chemical Formula 2:

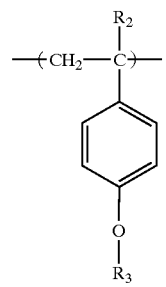

wherein $R_1$ and $R_2$ are the same or different and selected from the group consisting of an alkyl group, a chlorine atom and an alkyl group including a fluorine atom; $R_3$ is a protecting group released by an acid; and m is an integer of 0 through 5. Subsequently, the resist film is irradiated with exposing light of a wavelength shorter than a 180 nm band for pattern exposure, and a resist pattern is formed by developing the resist film after the pattern exposure.

20 Claims, 2 Drawing Sheets

PATTERN FORMATION MATERIAL AND PATTERN FORMATION METHOD

BACKGROUND OF THE INVENTION

The present invention relates to a pattern formation method and a pattern formation material, and more particularly, it relates to a pattern formation method for forming a resist pattern, used for forming a semiconductor device or a semiconductor integrated circuit on a semiconductor substrate, by using exposing light of a wavelength shorter than a 180 nm band and a pattern formation material used in the pattern formation method.

Currently, in fabrication of a mass storage semiconductor integrated circuit, such as a 64 Mbit dynamic random access memory (DRAM) and a logic device or a system LSI with a 0.25 μm through 0.15 μm rule, a resist pattern is formed by using a chemically amplified resist material including a polyhydroxystyrene derivative and an acid generator as principal constituents with KrF excimer laser (of a wavelength of a 248 nm band) used as exposing light.

Moreover, for fabrication of a 256 Mbit DRAM, a 1 Gbit DRAM or a system LSI with a 0.15 μm through 0.13 μm rule, a pattern formation method using, as exposing light, ArF excimer laser lasing at a shorter wavelength (of a 193 nm band) than the KrF excimer laser is now under development.

The resist material including a polyhydroxystyrene derivative as a principal constituent has high absorbance against light of a wavelength of a 193 nm band because of an aromatic ring included therein. Therefore, exposing light of a wavelength of a 193 nm band cannot uniformly reach the bottom of a resist film, and hence, a pattern cannot be formed in a good shape. Accordingly, the resist material including a polyhydroxystyrene derivative as a principal constituent cannot be used when the ArF excimer laser is used as the exposing light.

Therefore, a chemically amplified resist material including, as a principal constituent, a polyacrylic acid derivative or a polycycloolefin derivative having no aromatic ring is used when the ArF excimer laser is used as the exposing light.

On the other hand, as exposing light for a pattern formation method capable of coping with high resolution, an electron beam (EB) and the like are being examined.

When the EB is used as the exposing light, however, the throughput is disadvantageously low, and hence, the EB is not suitable to mass production.

Accordingly, in order to form a resist pattern finer than 0.10 μm, it is necessary to use exposing light of a wavelength shorter than that of the ArF excimer laser, such as $Xe_2$ laser (of a wavelength of a 172 nm band), $F_2$ laser (of a wavelength of a 157 nm band), $Kr_2$ laser (of a wavelength of a 146 nm band), ArKr laser (of a wavelength of a 134 nm band), $Ar_2$ laser (of a wavelength of a 126 nm band), soft-X rays (of a wavelength of a 13, 11 or 5 nm band) and hard-X rays (of a wavelength shorter than a 1 nm band). In other words, a resist pattern is required to be formed by using exposing light of a wavelength shorter than a 180 nm band.

Therefore, the present inventors have formed resist patterns by conducting pattern exposure using $F_2$ laser (of a wavelength of a 157 nm band) on resist films formed from conventionally known chemically amplified resist materials respectively including a polyhydroxystyrene derivative represented by Chemical Formula A, a polyacrylic acid derivative represented by Chemical Formula B and a polycycloolefin derivative represented by Chemical Formula C.

Chemical Formula A:

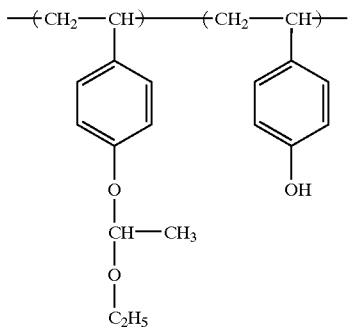

Chemical Formula B:

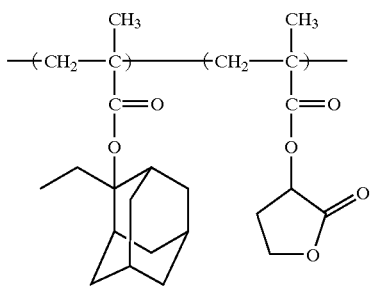

Chemical Formula C:

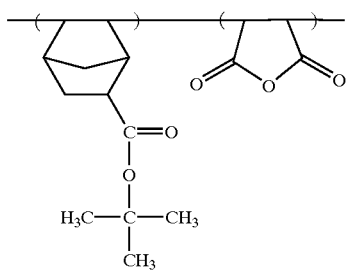

Now, a method for forming a resist pattern by using any of the aforementioned conventional chemically amplified resist materials and problems arising in the conventional method will be described with reference to FIGS. 2A through 2D.

First, as shown in FIG. 2A, the chemically amplified resist material is applied on a semiconductor substrate 1 by spin coating and the resultant is heated, so as to form a resist film 2 with a thickness of 0.3 μm. Thereafter, as shown in FIG. 2B, the resist film 2 is irradiated with a $F_2$ laser beam 4 through a mask 3 for pattern exposure. Thus, an acid is generated from the acid generator in an exposed portion 2a of the resist film 2 while no acid is generated in an unexposed portion 2b of the resist film 2.

Next, as shown in FIG. 2C, the semiconductor substrate 1 is heated with a hot plate at, for example, 100° C. for 60 seconds.

Then, the resist film 2 is developed with an alkaline developer, thereby forming a resist pattern 5.

However, as shown in FIG. 2D, the resist pattern 5 cannot be formed in a good pattern shape, and there remains much scum on the semiconductor substrate 1. Such problems occur not only in using the $F_2$ laser beam as the exposing light but also in using any of the other light of a wavelength shorter than a 180 nm band.

Accordingly, a resist pattern cannot be practically formed by irradiating a resist film made from any of the aforementioned chemically amplified resist materials with light of a wavelength shorter than a 180 nm band.

SUMMARY OF THE INVENTION

In consideration of the aforementioned conventional problems, an object of the invention is forming a resist pattern in a good pattern shape by using exposing light of a wavelength shorter than a 180 nm band with minimally producing scum.

The present inventors have studied the causes of the conventional problems occurring in using the conventional chemically amplified resist materials and have found the following:

First, the chemically amplified resist materials have high absorbance against light of a wavelength shorter than a 180 nm band. For example, a resist film with a thickness of 100 nm made from the chemically amplified resist material including a polyhydroxystyrene derivative as a principal constituent has transmittance of 20% at most against a $F_2$ laser beam (of a wavelength of a 157 nm band).

Therefore, various examination has been made on means for improving the transmittance of a chemically amplified resist material against light of a wavelength shorter than a 180 nm band. As a result, it has been found that the transmittance of a chemically amplified resist material against light of a wavelength shorter than a 180 nm band can be improved when a unit of a polyhydroxystyrene derivative having hexafluoroisopropyl alcohol (($CF_3$)$_2$C—OH) on its side chain is introduced into a base polymer.

Furthermore, when any of the aforementioned chemically amplified resist materials, particularly the resist material including a polyhydroxystyrene derivative, is irradiated with light of a wavelength shorter than a 180 nm band, a reaction is caused regardless of the function of an acid, so that a hydrogen atom bonded to carbon located at the á-position of the principal chain of the polymer can be released and that polymer radicals from which the hydrogen atoms are released can bond to each other to be crosslinked. As a result, the solubility of an exposed portion of the resist film in a developer is degraded. Therefore, means for preventing the crosslinking reaction of the principal chains of the polymer of a chemically amplified resist material has been variously studied. As a result, it has been found that the crosslinking reaction of the principal chains can be avoided by substituting an alkyl group or a chlorine atom for a hydrogen atom located at the á-position of the principal chain of the polymer.

Moreover, since the polymer has an aromatic ring on a side chain thereof, the dry etching resistance and the heat resistance of the resist film can be improved.

In addition, when hexafluoroisopropanol is introduced into an aromatic ring of the polyhydroxystyrene derivative, the transmittance against light of a wavelength shorter than a 180 nm band can be improved, and the solubility in a developer of a hydroxyl group from which a protecting group has been released can be improved. As a result, the contrast in the solubility between an exposed portion and an unexposed portion of the resist film can be improved.

The present invention was devised on the basis of the aforementioned findings, and specifically provides pattern formation materials and methods described below.

The first pattern formation material of this invention comprises a polymer including a first unit represented by Chemical Formula 1 and a second unit represented by Chemical Formula 2; and an acid generator:

Chemical Formula 1:

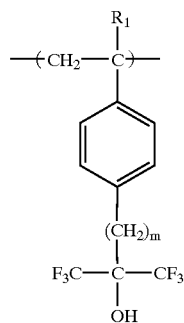

Chemical Formula 2:

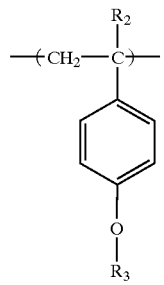

wherein $R_1$ and $R_2$ are the same or different and selected from the group consisting of an alkyl group, a chlorine atom and an alkyl group including a fluorine atom; $R_3$ is a protecting group released by an acid; and m is an integer of 0 through 5.

In the first pattern formation material, since the first unit has a hexafluoroisopropyl group, the transmittance against light of a wavelength shorter than a 180 nm band can be largely improved. Furthermore, since an alkyl group, a chlorine atom or an alkyl group including a fluorine atom is substituted for hydrogen atoms located at the á-positions of the principal chains of the first and second units, the crosslinking reaction of the principal chains can be prevented, resulting in improving the solubility of an exposed portion of a resist film in a developer. Moreover, since an alcohol portion of the first unit has a trifluoromethyl group, the solubility of a hydroxyl group in the developer can be improved, so as to improve the solubility of the exposed portion of the resist film in the developer. Accordingly, the contrast in the solubility between the exposed portion and an unexposed portion of the resist film can be improved. In addition, since the first and second units have a benzene ring, the dry etching resistance can be improved.

The second pattern formation material of this invention comprises a polymer including a first unit represented by Chemical Formula 3, a second unit represented by Chemical Formula 4 and a third unit represented by Chemical Formula 5; and an acid generator:

Chemical Formula 3:

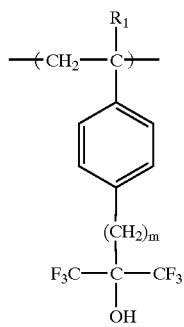

Chemical Formula 4:

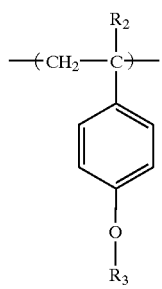

Chemical Formula 5:

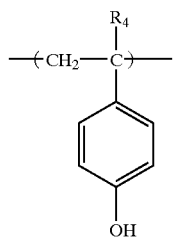

wherein $R_1$, $R_2$ and $R_4$ are the same or different and selected from the group consisting of an alkyl group, a chlorine atom and an alkyl group including a fluorine atom; $R_3$ is a protecting group released by an acid; and m is an integer of 0 through 5.

In the second pattern formation material, since the first unit has a hexafluoroisopropyl group, the transmittance against light of a wavelength shorter than a 180 nm band can be largely improved. Furthermore, since an alkyl group, a chlorine atom or an alkyl group including a fluorine atom is substituted for hydrogen atoms located at the á-positions of the principal chains of the first, second and third units, the crosslinking reaction of the principal chains can be prevented, resulting in improving the solubility of an exposed portion of a resist film in a developer. Moreover, since an alcohol portion of the first unit has a trifluoromethyl group, the solubility of a hydroxyl group in the developer can be improved, so as to improve the solubility of the exposed portion of the resist film in the developer. Accordingly, the contrast in the solubility between the exposed portion and an unexposed portion of the resist film can be largely improved. In addition, since the first, second and third units have a benzene ring, the dry etching resistance can be largely improved. Furthermore, since the third unit has a hydroxyl group, the wettability is improved so as to improve the adhesion to the substrate, and the dissolving rate in an alkaline developer can be controlled by adjusting the ratio of the third unit in the polymer.

The third pattern formation material of this invention comprises a polymer including a first unit represented by Chemical Formula 6 and a second unit represented by Chemical Formula 7; and an acid generator:

Chemical Formula 6:

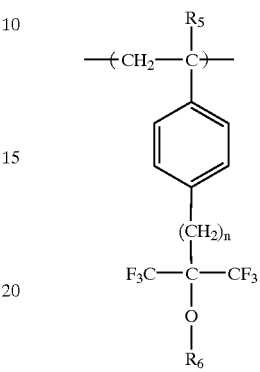

Chemical Formula 7:

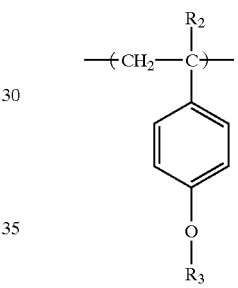

wherein $R_2$ and $R_5$ are the same or different and selected from the group consisting of an alkyl group, a chlorine atom and an alkyl group including a fluorine atom; $R_3$ and $R_6$ are the same or different, at least one of which is a protecting group released by an acid; and n is an integer of 0 through 5.

In the third pattern formation material, since the first unit has a hexafluoroisopropyl group, the transmittance against light of a wavelength shorter than a 180 nm band can be largely improved. Furthermore, since an alkyl group, a chlorine atom or an alkyl group including a fluorine atom is substituted for hydrogen atoms located at the á-positions of the principal chains of the first and second units, the crosslinking reaction of the principal chains can be prevented, resulting in improving the solubility of an exposed portion of a resist film in a developer. Moreover, since an alcohol portion of the first unit has a trifluoromethyl group, the solubility in the developer of a hydroxyl group from which a protecting group has been released can be improved, so as to improve the solubility of the exposed portion of the resist film in the developer. Accordingly, the contrast in the solubility between the exposed portion and an unexposed portion of the resist film can be largely improved. In addition, since the first and second units have a benzene ring, the dry etching resistance can be improved.

The fourth pattern formation material of this invention comprises a polymer including a first unit represented by Chemical Formula 8 and a second unit represented by Chemical Formula 9; and an acid generator:

Chemical Formula 8:

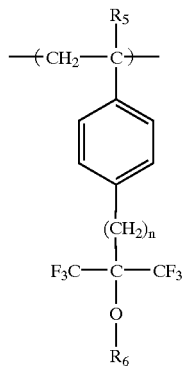

Chemical Formula 9:

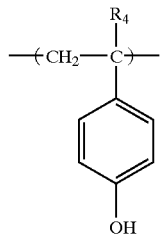

wherein $R_4$ and $R_5$ are the same or different and selected from the group consisting of an alkyl group, a chlorine atom and an alkyl group including a fluorine atom; $R_6$ is a protecting group released by an acid; and n is an integer of 0 through 5.

In the fourth pattern formation material, since the first unit has a hexafluoroisopropyl group, the transmittance against light of a wavelength shorter than a 180 nm band can be largely improved. Furthermore, since an alkyl group, a chlorine atom or an alkyl group including a fluorine atom is substituted for hydrogen atoms located at the á-positions of the principal chains of the first and second units, the crosslinking reaction of the principal chains can be prevented, resulting in improving the solubility of an exposed portion of a resist film in a developer. Moreover, since an alcohol portion of the first unit has a trifluoromethyl group, the solubility in the developer of a hydroxyl group from which a protecting group has been released can be improved, so as to improve the solubility of the exposed portion of the resist film in the developer. Accordingly, the contrast in the solubility between the exposed portion and an unexposed portion of the resist film can be largely improved. In addition, since the first and second units have a benzene ring, the dry etching resistance can be improved. Furthermore, since the second unit has a hydroxyl group, the wettability is improved so as to improve the adhesion to the substrate, and the dissolving rate in an alkaline developer can be controlled by adjusting the ratio of the second unit in the polymer.

The fifth pattern formation material of this invention comprises a polymer including a first unit represented by Chemical Formula 10, a second unit represented by Chemical Formula 11 and a third unit represented by Chemical Formula 12; and an acid generator:

Chemical Formula 10:

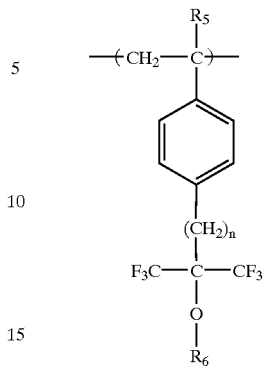

Chemical Formula 11:

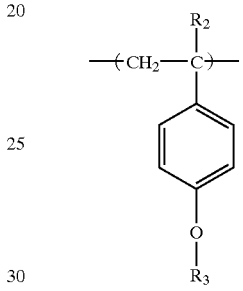

Chemical Formula 12:

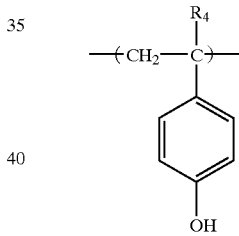

wherein $R_2$, $R_4$ and $R_5$ are the same or different and selected from the group consisting of an alkyl group, a chlorine atom and an alkyl group including a fluorine atom; $R_3$ and $R_6$ are the same or different, at least one of which is a protecting group released by an acid; and n is an integer of 0 through 5.

In the fifth pattern formation material, since the first unit has a hexafluoroisopropyl group, the transmittance against light of a wavelength shorter than a 180 nm band can be largely improved. Furthermore, since an alkyl group, a chlorine atom or an alkyl group including a fluorine atom is substituted for hydrogen atoms located at the á-positions of the principal chains of the first, second and third units, the crosslinking reaction of the principal chains can be prevented, resulting in improving the solubility of an exposed portion of a resist film in a developer. Moreover, since an alcohol portion of the first unit has a trifluoromethyl group, the solubility in the developer of a hydroxyl group from which a protecting group has been released can be improved, so as to improve the solubility of the exposed portion of the resist film in the developer. Accordingly, the contrast in the solubility between the exposed portion and an unexposed portion of the resist film can be largely improved.

In addition, since the first, second and third units have a benzene ring, the dry etching resistance can be improved. Furthermore, since the third unit has a hydroxyl group, the wettability can be improved so as to improve the adhesion to the substrate, and the dissolving rate in an alkaline developer can be controlled by adjusting the ratio of the third unit in the polymer. In addition, when an acid is generated through irradiation with light so as to release a protecting group also from the second unit, a hydroxyl group is generated in the exposed portion of the resist film, and hence, the contrast between the exposed portion and the unexposed portion of the resist film can be improved.

Specific examples of the protecting group released by an acid represented by $R_3$ in the aforementioned general formulas are those represented by Chemical Formula 13:

Chemical Formula 13:

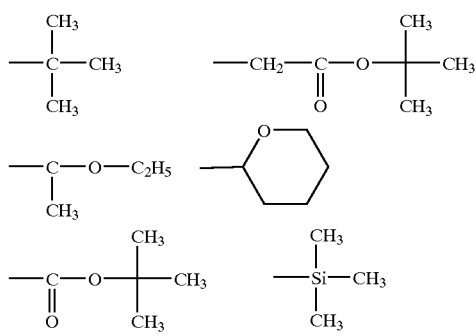

Specific examples of the protecting group released by an acid represented by $R_6$ in the aforementioned general formulas are those represented by Chemical Formula 14:

Chemical Formula 14:

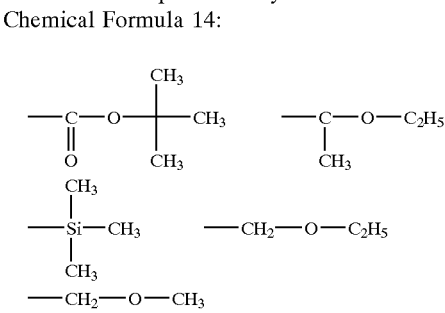

The first pattern formation method of this invention comprises the steps of forming a resist film by applying, on a substrate, the first pattern formation material; irradiating the resist film with exposing light of a wavelength shorter than a 180 nm band for pattern exposure; and forming a resist pattern by developing the resist film after the pattern exposure.

In the first pattern formation method, since the first pattern formation material is used, the transmittance against light of a wavelength shorter than a 180 nm band can be largely improved, the solubility of an exposed portion of the resist film in a developer can be improved, the dry etching resistance can be improved, and the contrast in the solubility between the exposed portion and an unexposed portion of the resist film can be largely improved.

The second pattern formation method of this invention comprises the steps of forming a resist film by applying, on a substrate, the second pattern formation material; irradiating the resist film with exposing light of a wavelength shorter than a 180 nm band for pattern exposure; and forming a resist pattern by developing the resist film after the pattern exposure.

In the second pattern formation method, since the second pattern formation material is used, the transmittance against light of a wavelength shorter than a 180 nm band can be largely improved, the solubility of an exposed portion of the resist film in a developer can be improved, the dry etching resistance can be improved, and the contrast in the solubility between the exposed portion and an unexposed portion of the resist film can be largely improved. Furthermore, the wettability of the pattern formation material can be improved so as to improve the adhesion to the substrate, and the dissolving rate in an alkaline developer can be controlled by adjusting the ratio of the third unit in the polymer.

The third pattern formation method of this invention comprises the steps of forming a resist film by applying, on a substrate, the third pattern formation material; irradiating the resist film with exposing light of a wavelength shorter than a 180 nm band for pattern exposure; and forming a resist pattern by developing the resist film after the pattern exposure.

In the third pattern formation method, since the third pattern formation material is used, the transmittance against light of a wavelength shorter than a 180 nm band can be largely improved, the solubility of an exposed portion of the resist film in a developer can be improved, the dry etching resistance can be improved, and the contrast in the solubility between the exposed portion and an unexposed portion of the resist film can be largely improved. Furthermore, since hexafluoroisopropyl alcohol is generated in the exposed portion of the resist film through the irradiation with light, the contrast between the exposed portion and the unexposed portion can be improved.

The fourth pattern formation method of this invention comprises the steps of forming a resist film by applying, on a substrate, the fourth pattern formation material; irradiating the resist film with exposing light of a wavelength shorter than a 180 nm band for pattern exposure; and forming a resist pattern by developing the resist film after the pattern exposure.

In the fourth pattern formation method, since the fourth pattern formation material is used, the transmittance against light of a wavelength shorter than a 180 nm band can be largely improved, the solubility of an exposed portion of the resist film in a developer can be improved, the dry etching resistance can be improved, and the contrast in the solubility between the exposed portion and an unexposed portion of the resist film can be largely improved. Furthermore, the wettability of the pattern formation material can be improved so as to improve the adhesion to the substrate, and the dissolving rate in an alkaline developer can be controlled by adjusting the ratio of the second unit in the polymer.

The fifth pattern formation method of this invention comprises the steps of forming a resist film by applying, on a substrate, the fifth pattern formation material; irradiating the resist film with exposing light of a wavelength shorter than a 180 nm band for pattern exposure; and forming a resist pattern by developing the resist film after the pattern exposure.

In the fifth pattern formation method, since the fifth pattern formation material is used, the transmittance against light of a wavelength shorter than a 180 nm band can be largely improved, the solubility of an exposed portion of the resist film in a developer can be improved, the dry etching resistance can be improved, and the contrast in the solubility between the exposed portion and an unexposed portion of the resist film can be largely improved. Furthermore, the wettability of the pattern formation material can be improved so as to improve the adhesion to the substrate, and the dissolving rate in an alkaline developer can be controlled by adjusting the ratio of the third unit in the polymer. Moreover, since hexafluoroisopropyl alcohol is generated in the exposed portion of the resist film through the irradiation with light, the contrast between the exposed portion and the unexposed portion can be improved.

In any of the first through fifth pattern formation methods, the exposing light can be light of a wavelength of a 110 through 180 nm band such as a $Xe_2$ laser beam, a $F_2$ laser beam, a $Kr_2$ laser beam, an ArKr laser beam or an $Ar_2$ laser beam; soft-X rays of a wavelength of a 1 through 30 nm band; or hard-X rays of a wavelength shorter than a 1 nm band.

DETAILED DESCRIPTION OF THE INVENTION

Embodiment 1

A pattern formation material and a pattern formation method according to Embodiment 1 of the invention will now be described with reference to FIGS. 1A through 1D.

In this embodiment, the first pattern formation material and the first pattern formation method described above are embodied, and the specific composition of a resist material of this embodiment is as follows:

Base polymer: a polymer represented by Chemical Formula 15 below

Acid generator: triphenylsulfonium triflate (2 wt % based on the base polymer)

Solvent: diglime

Chemical Formula 15:

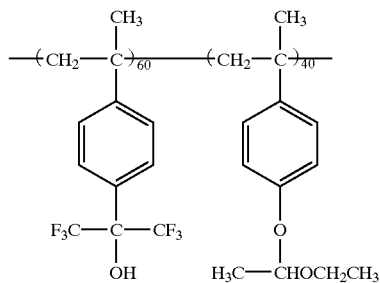

Figure 1A:
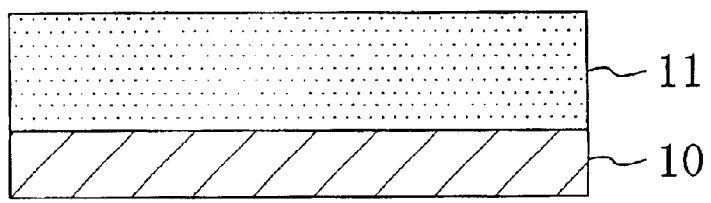
FIGS. 1A, 1B, 1C and 1D are cross-sectional views for showing procedures in a pattern formation method according to any of Embodiments 1 through 5 of the invention.

First, as shown in FIG. 1A, the resist material having the above-described composition is applied on a semiconductor substrate 10 by spin coating, thereby forming a resist film 11 with a thickness of 0.2 μm. At this point, since the base polymer is alkali-refractory, the resist film 11 is alkali-refractory.

Figure 1B:
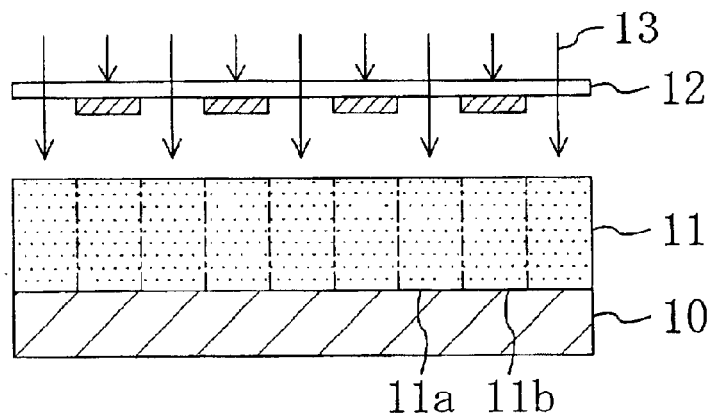

Next, as shown in FIG. 1B, the resist film 11 is subjected to pattern exposure by irradiating through a mask 12 with $F_2$ excimer laser 13 (of a wavelength of a 157 nm band). Thus, an acid is generated from the acid generator in an exposed portion 11a of the resist film 11 while no acid is generated in an unexposed portion 11b of the resist film 11.

Figure 1C:
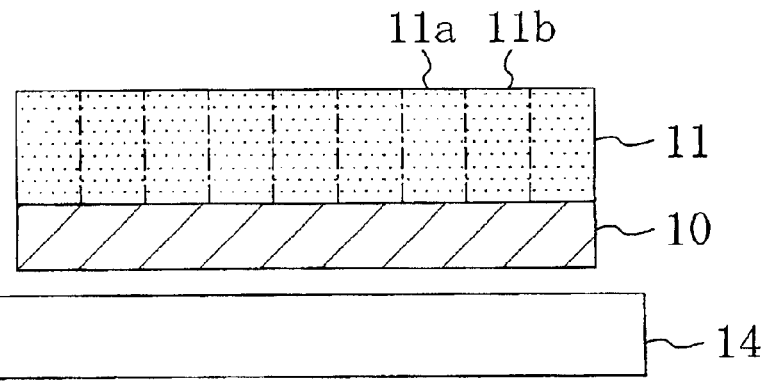

Then, as shown in FIG. 1C, the semiconductor substrate 10 together with the resist film 11 is heated with a hot plate 14. Thus, the base polymer is heated in the presence of the acid in the exposed portion 11a of the resist film 11, so as to release a protecting group of a unit on the right hand side in Chemical Formula 15. As a result, the base polymer becomes alkali-soluble.

Figure 1D:
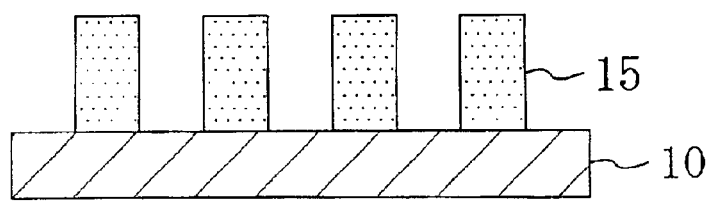
Figure 2A:
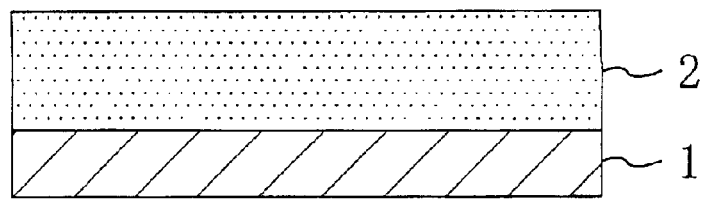
FIGS. 2A, 2B, 2C and 2D are cross-sectional views for showing procedures in a conventional pattern formation method.
Figure 2B:
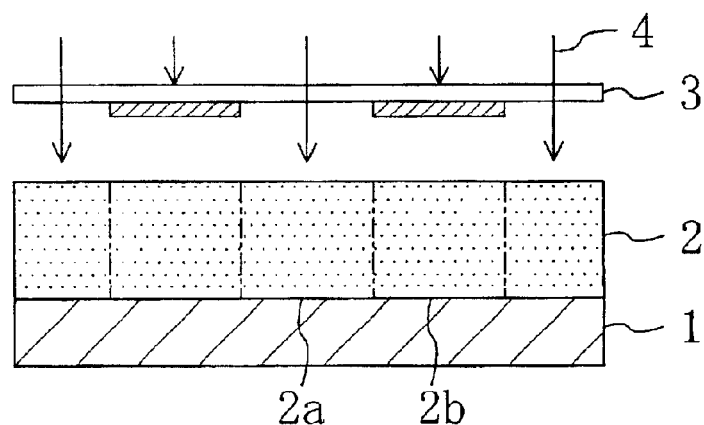
Figure 2C:
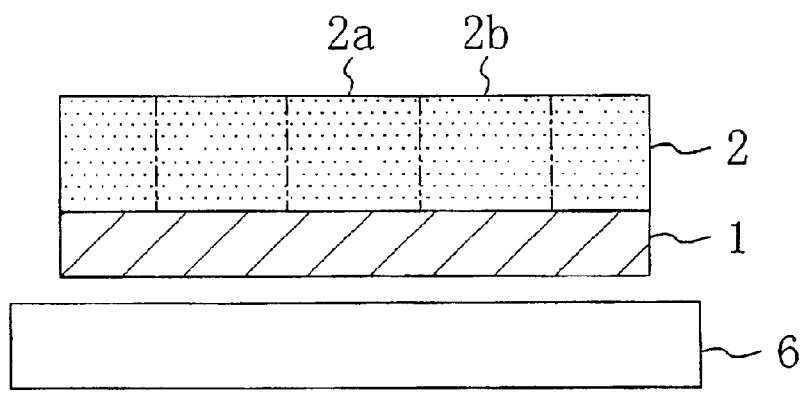
Figure 2D:
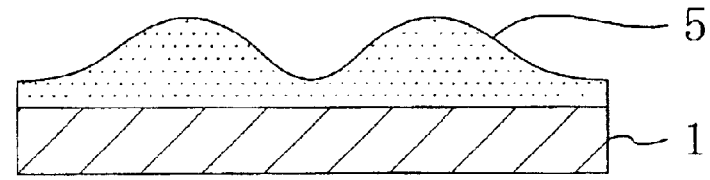

Subsequently, the resist film 11 is developed with an alkaline developer such as a tetramethylammonium hydroxide aqueous solution. Thus, the exposed portion 11a of the resist film 11 is dissolved in the developer, so that a resist pattern 15 can be formed from the unexposed portion 11b of the resist film 11 as shown in FIG. 1D.

In the base polymer of Embodiment 1 represented by Chemical Formula 15, $R_1$ and $R_2$ of first and second units respectively represented by Chemical Formulas 1 and 2 are both $CH_3$. Instead, $R_1$ and $R_2$ may be another alkyl group such as $C_2H_5$, a chlorine atom or an alkyl group including a fluorine atom such as $CF_3$. In this case, $R_1$ and $R_2$ may be the same or different from each other.

Also, in the base polymer of Embodiment 1 represented by Chemical Formula 15, m of the first unit represented by Chemical Formula 1 is 0. Instead, m may be 1, 2, 3, 4 or 5.

Embodiment 2

A pattern formation material and a pattern formation method according to Embodiment 2 of the invention will now be described. Embodiment 2 is different from Embodiment 1 in the resist material alone, and hence, the resist material alone will be herein described.

In this embodiment, the second pattern formation material and the second pattern formation method described above are embodied, and the specific composition of the resist material is as follows:

Base polymer: a polymer represented by Chemical Formula 16 below

Acid generator: triphenylsulfonium triflate (2 wt % based on the base polymer)

Solvent: diglime

Chemical Formula 16:

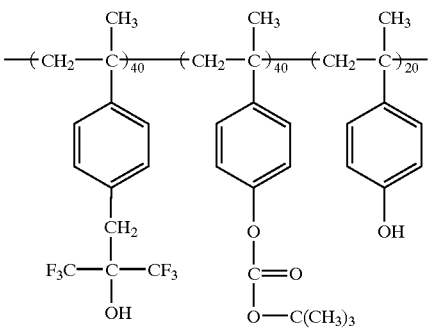

In the base polymer of Embodiment 2 represented by Chemical Formula 16, $R_1$, $R_2$ and $R_4$ of first, second and third units respectively represented by Chemical Formulas 3, 4 and 5 are all $CH_3$. Instead, they may be another alkyl group such as $C_2H_5$, a chlorine atom or an alkyl group including a fluorine atom such as $CF_3$. In this case, $R_1$, $R_2$ and $R_4$ may be the same or different from one another.

Also, in the base polymer of Embodiment 2 represented by Chemical Formula 16, m of the first unit represented by Chemical Formula 3 is 1. Instead, m may be 0, 2, 3, 4 or 5.

Embodiment 3

A pattern formation material and a pattern formation method according to Embodiment 3 of the invention will now be described. Embodiment 3 is different from Embodiment 1 in the resist material alone, and hence, the resist material alone will be herein described.

In this embodiment, the third pattern formation material and the third pattern formation method described above are embodied, and the specific composition of the resist material is as follows:

Base polymer: a polymer represented by Chemical Formula 17 below

Acid generator: triphenylsulfonium triflate (2 wt % based on the base polymer)

Solvent: diglime

Chemical Formula 17:

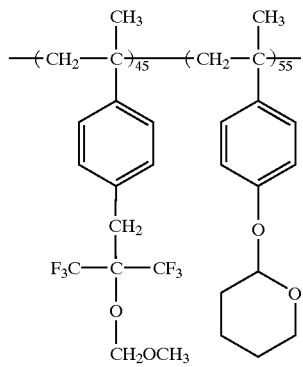

In the base polymer of Embodiment 3 represented by Chemical Formula 17, $R_5$ and $R_2$ of first and second units respectively represented by Chemical Formulas 6 and 7 are both $CH_3$. Instead, they may be another alkyl group such as $C_2H_5$, a chlorine atom or an alkyl group including a fluorine atom such as $CF_3$. In this case, $R_5$ and $R_2$ may be the same or different from one another.

Also, in the base polymer of Embodiment 3 represented by Chemical Formula 17, n of the first unit represented by Chemical Formula 6 is 1. Instead, n may be 0, 2, 3, 4 or 5.

Embodiment 4

A pattern formation material and a pattern formation method according to Embodiment 4 of the invention will now be described. Embodiment 4 is different from Embodiment 1 in the resist material alone, and hence, the resist material alone will be herein described.

In this embodiment, the fourth pattern formation material and the fourth pattern formation method described above are embodied, and the specific composition of the resist material is as follows:

Base polymer: a polymer represented by Chemical Formula 18 below

Acid generator: triphenylsulfonium triflate (2 wt % based on the base polymer)

Solvent: diglime

Chemical Formula 18:

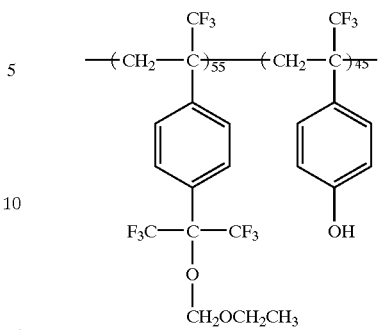

In the base polymer of Embodiment 4 represented by Chemical Formula 18, $R_5$ and $R_4$ of first and second units respectively represented by Chemical Formulas 8 and 9 are both $CF_3$. Instead, they may be an alkyl group such as $CH_3$ or $C_2H_5$, a chlorine atom or another alkyl group including a fluorine atom. In this case, $R_5$ and $R_4$ may be the same or different from each other.

Also, in the base polymer of Embodiment 4 represented by Chemical Formula 18, n of the first unit represented by Chemical Formula 8 is 0. Instead, n may be 1, 2, 3, 4 or 5.

Embodiment 5

A pattern formation material and a pattern formation method according to Embodiment 5 of the invention will now be described. Embodiment 5 is different from Embodiment 1 in the resist material alone, and hence, the resist material alone will be herein described.

In this embodiment, the fifth pattern formation material and the fifth pattern formation method described above are embodied, and the specific composition of the resist material is as follows:

Base polymer: a polymer represented by Chemical Formula 19 below

Acid generator: triphenylsulfonium triflate (2 wt % based on the base polymer)

Solvent: diglime

Chemical Formula 19:

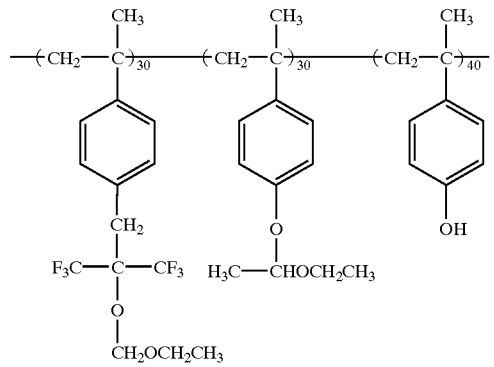

In the base polymer of Embodiment 5 represented by Chemical Formula 19, $R_5$, $R_2$ and $R_4$ of first, second and third units respectively represented by Chemical Formulas 10, 11 and 12 are all $CH_3$. Instead, they may be another alkyl group such as $C_2H_5$, a chlorine atom or an alkyl group including a fluorine atom such as $CF_3$. In this case, $R_5$, $R_2$ and $R_4$ may be the same or different from one another.

Also, in the base polymer of Embodiment 5 represented by Chemical Formula 19, n of the first unit represented by Chemical Formula 10 is 1. Instead, n may be 0, 2, 3, 4 or 5.

What is claimed is:

1. A pattern formation method comprising the steps of:

forming a resist film by applying, on a substrate, a pattern formation material containing a polymer including a first unit represented by Chemical Formula 1 and a second unit represented by Chemical Formula 2, and an acid generator:

Chemical Formula 1:

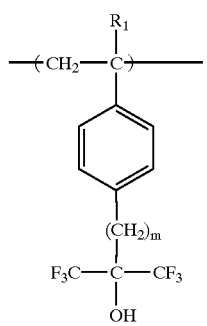

Chemical Formula 2:

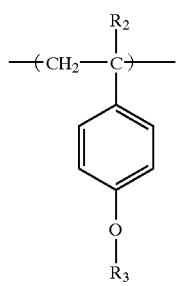

wherein $R_1$ and $R_2$ are the same or different and selected from the group consisting of an alkyl group, a chlorine atom and an alkyl group including a fluorine atom; $R_3$ is a protecting group released by an acid; and m is an integer of 0 through 5;

irradiating said resist film with exposing light of a wavelength shorter than a 180 nm band for pattern exposure; and forming a resist pattern by developing said resist film after the pattern exposure.

2. The pattern formation method of claim 1, wherein said exposing light is a $Xe_2$ laser beam, a $F_2$ laser beam, a $Kr_2$ laser beam, an ArKr laser beam or an $Ar_2$ laser beam.

3. The pattern formation method of claim 1, wherein said exposing light is soft-X rays.

4. The pattern formation method of claim 1, wherein said exposing light is hard-X rays.

5. A pattern formation method comprising the steps of:

forming a resist film by applying, on a substrate, a pattern formation material containing a polymer including a first unit represented by Chemical Formula 3, a second unit represented by Chemical Formula 4 and a third unit represented by Chemical Formula 5, and an acid generator:

Chemical Formula 3:

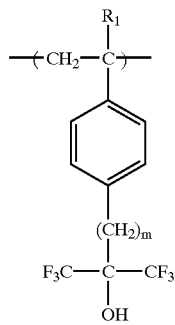

Chemical Formula 4:

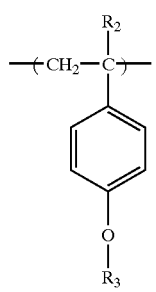

Chemical Formula 5:

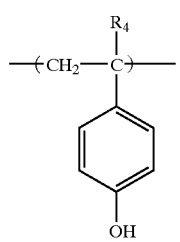

wherein $R_1$, $R_2$ and $R_4$ are the same or different and selected from the group consisting of an alkyl group, a chlorine atom and an alkyl group including a fluorine atom; $R_3$ is a protecting group released by an acid; and m is an integer of 0 through 5;

irradiating said resist film with exposing light of a wavelength shorter than a 180 nm band for pattern exposure; and forming a resist pattern by developing said resist film after the pattern exposure.

6. The pattern formation method of claim 5, wherein said exposing light is a $Xe_2$ laser beam, a $F_2$ laser beam, a $Kr_2$ laser beam, an ArKr laser beam or an $Ar_2$ laser beam.

7. The pattern formation method of claim 5, wherein said exposing light is soft-X rays.

8. The pattern formation method of claim 5, wherein said exposing light is hard-X rays.

9. A pattern formation method comprising the steps of:

forming a resist film by applying, on a substrate, a pattern formation material containing a polymer including a first unit represented by Chemical Formula 6 and a second unit represented by Chemical Formula 7, and an acid generator:

Chemical Formula 6:

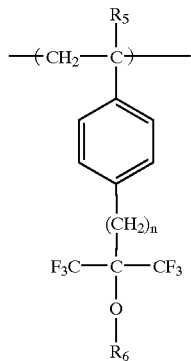

Chemical Formula 8:

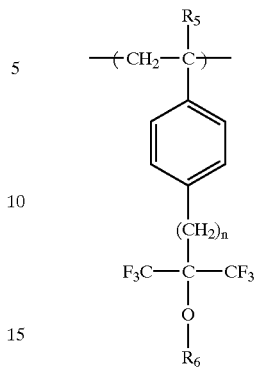

Chemical Formula 7:

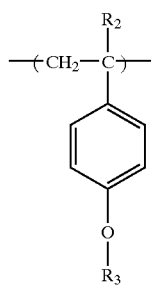

Chemical Formula 9:

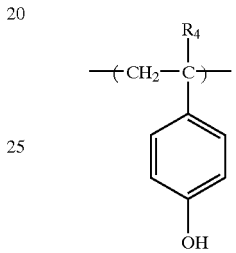

wherein $R_2$ and $R_5$ are the same or different and selected from the group consisting of an alkyl group, a chlorine atom and an alkyl group including a fluorine atom; $R_3$ and $R_6$ are the same or different, at least one of which is a protecting group released by an acid; and n is an integer of 0 through 5;

irradiating said resist film with exposing light of a wavelength shorter than a 180 nm band for pattern exposure; and forming a resist pattern by developing said resist film after the pattern exposure.

10. The pattern formation method of claim 9, wherein said exposing light is a $Xe_2$ laser beam, a $F_2$ laser beam, a $Kr_2$ laser beam, an ArKr laser beam or an $Ar_2$ laser beam.

11. The pattern formation method of claim 9, wherein said exposing light is soft-X rays.

12. The pattern formation method of claim 9, wherein said exposing light is hard-X rays.

13. A pattern formation method comprising the steps of:

forming a resist film by applying, on a substrate, a pattern formation material containing a polymer including a first unit represented by Chemical Formula 8 and a second unit represented by Chemical Formula 9, and an acid generator:

wherein $R_4$ and $R_5$ are the same or different and selected from the group consisting of an alkyl group, a chlorine atom and an alkyl group including a fluorine atom; $R_6$ is a protecting group released by an acid; and n is an integer of 0 through 5;

irradiating said resist film with exposing light of a wavelength shorter than a 180 nm band for pattern exposure; and forming a resist pattern by developing said resist film after the pattern exposure.

14. The pattern formation method of claim 13, wherein said exposing light is a $Xe_2$ laser beam, a $F_2$ laser beam, a $Kr_2$ laser beam, an ArKr laser beam or an $Ar_2$ laser beam.

15. The pattern formation method of claim 13, wherein said exposing light is soft-X rays.

16. The pattern formation method of claim 13, wherein said exposing light is hard-X rays.

17. A pattern formation method comprising the steps of:

forming a resist film by applying, on a substrate, a pattern formation material containing a polymer including a first unit represented by Chemical Formula 10, a second unit represented by Chemical Formula 11 and a third unit represented by Chemical Formula 12, and an acid generator:

Chemical Formula 10:

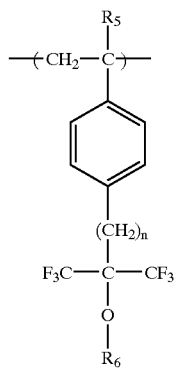

Chemical Formula 11:

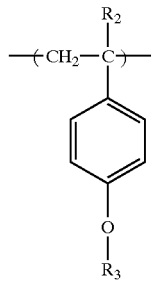

Chemical Formula 12:

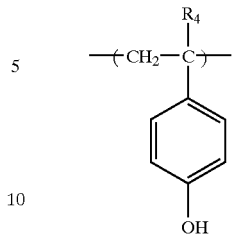

wherein $R_2$, $R_4$ and $R_5$ are the same or different and selected from the group consisting of an alkyl group, a chlorine atom and an alkyl group including a fluorine atom; $R_3$ and $R_6$ are the same or different, at least one of which is a protecting group released by an acid; and n is an integer of 0 through 5;

irradiating said resist film with exposing light of a wavelength shorter than a 180 nm band for pattern exposure; and forming a resist pattern by developing said resist film after the pattern exposure.

18. The pattern formation method of claim 17, wherein said exposing light is a $Xe_2$ laser beam, a $F_2$ laser beam, a $Kr_2$ laser beam, an ArKr laser beam or an $Ar_2$ laser beam.

19. The pattern formation method of claim 17, wherein said exposing light is soft-X rays.

20. The pattern formation method of claim 17, wherein said exposing light is hard-X rays.

* * * * *